United States Patent [19]

Baier

[11] Patent Number: 5,434,889
[45] Date of Patent: Jul. 18, 1995

[54] RECEIVER COMPRISING AN ARRANGEMENT FOR ESTIMATING A FREQUENCY DEVIATION

[75] Inventor: Alfred Baier, Eckental, Germany

[73] Assignee: U.S. Philips Corporation, New York, N.Y.

[21] Appl. No.: 691,204

[22] Filed: Apr. 25, 1991

[30] Foreign Application Priority Data

Apr. 26, 1990 [DE] Germany .................. 40 13 384.2

[51] Int. Cl.⁶ ............................................. H04L 27/06
[52] U.S. Cl. ................................. 375/344; 375/346; 455/255
[58] Field of Search .................. 375/97, 39, 99, 13, 375/106; 329/308, 325; 331/34; 455/255, 240.1, 232.1, 245.1, 257

[56] References Cited

U.S. PATENT DOCUMENTS 4,887,050 12/1989 Borth et al. ...................... 331/34
4,947,409 8/1990 Raith et al. ...................... 375/97

*Primary Examiner*—Stephen Chin
*Assistant Examiner*—Tesfaldet Bocure
*Attorney, Agent, or Firm*—David R. Treacy

[57] ABSTRACT

In a base band conversion receiver, frequency deviation in the base band signal due to tolerances and drift of the transmitter frequency and of the mixing frequencies in the receiver is compensated by an automatic control. The signal converted to the base band is applied to a channel estimator which forms a channel estimation vector as an estimate of the instantaneous channel impulse responses in a complex bag band representation. A frequency deviation estimator evaluates the changes in time these channel estimation vectors.

17 Claims, 2 Drawing Sheets

RECEIVER COMPRISING AN ARRANGEMENT FOR ESTIMATING A FREQUENCY DEVIATION

BACKGROUND OF THE INVENTION

The invention relates to a receiver for signals transmitted with a carrier frequency, comprising a baseband conversion circuit and an arrangement for estimating a frequency deviation.

With baseband conversion of signals transmitted with a carrier frequency, signals received in the receiver are convened to the baseband frequency after they have been convened as appropriate to one or more intermediate frequencies, for example, by means of a quadrature mixer. Tolerances and drift of the transmitter frequency and of the mixing frequencies in the receiver may lead to a frequency deviation in the baseband signal, so that the transmission performance is affected in a negative fashion. In addition, Doppler effects in radio transmission systems comprising mobile transmit and/or receive arrangements make a relatively rapidly varying frequency deviation possible, which is additively superimposed on the afore-mentioned frequency deviation which varies only very slowly.

In order to avoid or restrict a negative effect on the transmission performance, which effect is caused by a frequency deviation in the receiver, it is necessary to continuously estimate the frequency deviation and keep this deviation as small as possible by means of an automatic mixing frequency control, or equalize this deviation by means of various analog or digital signal processing measures, for example, a frequency correction in the digitized baseband signal.

The article by F. D. Natali, "AFC Tracking Algorithms", in IEEE Transactions on Communications, Vol. COM-32, August 1984, pp. 935 to 947, discusses various circuit arrangements for estimating a frequency deviation for receivers having baseband conversion. These frequency deviation estimators are suitable for many digital modulation methods, but will operate satisfactorily only when the transmit channel is free from distortion or causes only little signal distortion. With strongly dispersive transmit channels, as they may occur in both radio transmission and line-bound transmission systems, the results obtained with these frequency deviation estimators are no longer satisfactory.

SUMMARY OF THE INVENTION

It is an object of the present invention to provide an arrangement for estimating the frequency deviation for receivers of the type mentioned in the preamble, which arrangement also operates to satisfaction with strongly dispersive transmit channels.

This object is achieved in that the signal converted to the baseband frequency is applied to a channel estimator which forms channel estimation vectors H as an estimate of the instantaneous channel impulse responses in a complex baseband representation, and in that the frequency deviation estimator evaluates the changes in time of these channel estimation vectors.

The invention is based on the understanding that a frequency deviation of the received signal leads to phase distortions in the time-varying channel impulse response. By analyzing the changes in time of the estimated channel impulse responses the frequency deviation can be estimated to satisfaction even with strongly dispersive transmission channels.

With a discrete-time signal representation or signal processing respectively, a channel estimation vector H determined by the channel estimator for the channel characteristic consists of $K+1$ complex elements $h_o, \ldots, h_K$. The time-dependent changes of the channel impulse responses can be determined and evaluated in an extremely simple manner by means of estimates of the channel impulse responses.

In the practical embodiment of the frequency deviation estimator this estimator calculates from two estimates of the channel impulse responses H(i) and H(j) performed at different instants t(i), t(j), a complex coefficient C(i) in accordance with the equation $$C(i) = \sum_{k=0}^{K} h_k(i) \cdot h_k(j)^*, \qquad (1)$$

where the raised asterisk expresses that the elements of the channel estimation vector H(j) concerned are replaced by their conjugate complex values before the coefficient. C(i) is formed.

When a frequency deviation in the mixing frequencies of the receiver is expressed by way of a frequency deviation in the channel impulse response, which is the same for all elements $h_k$ of the channel estimation vector H, the elements $h_k$ of the channel estimation vector H may have different instantaneous frequency deviations when there is a radio transmission over dispersive transmission channels, which deviations are caused by Doppler effects. The summation of the complex product values over all elements $H_k$, of the two channel estimation vectors concerned now provides an averaging of all individual frequency deviations, whilst a weighting according to the mean energy contribution $|h_k(i)| \cdot |h_k(j)|$ of the elements $h_k$ of the channel estimation vectors H(i) and H(j) is performed.

The frequency deviation of the received signal is proportional to the angle argument arg[C(i)] of the coefficient C(i). The proportionality factor between the frequency deviation df and the angle argument arg[C(i)] of the coefficient C(i) depends on the difference in time between the measuring instants t(i), t(j) at which the estimates H(i) and H(j) of the channel impulse responses are made which estimates are necessary for computing the coefficient C(i). The proportionality factor is constant provided that the distance in time between two channel estimations used for determining the frequency deviation is selected to be identical.

The exact equation for computing the frequency deviation df reads as follows:

$$df(i) = \frac{1}{2\pi \cdot [t(i) - t(j)]} \cdot arg[C(i)] \qquad (2)$$

An approximated calculation of the angle argument, provided that the absolute value of arg[C(i)] is smaller than $\pi/2$, can also be made by means of $$arg[C(i)] = \frac{\text{imaginary part } [C(i)]}{\text{real part } [C(i)]} \qquad (3)$$

This makes a simple and rapid and in most cases adequate estimation of the frequency deviation possible. Especially the calculation of trigonometric functions is always linked with computation circuitry and cost, whereas in the case of this estimation only a division is necessary.

In order to obtain statistically rather reliable estimates of the frequency deviation, it is advantageous to form a mean value of a plurality of calculations of the frequency deviation. This especially holds for radio channels affected by fading, for which single estimates may be highly unreliable. It is especially advantageous to form a complex meant value C each time from a specific number of consecutive complex coefficients C(i). For this purpose, the real parts of the complex coefficients may be simply added together separately from the imaginary parts. The frequency deviation df then results from (2) or (3) from the mean complex coefficient C. This way of averaging is possible since the value of the frequency deviation is obtained from the angle argument or from the ratio of imaginary part to real part of the complex coefficient and does not depend on the absolute value of the coefficient. Therefore, neither is it necessary to divide the sum obtained with this type of averaging by the number of the coefficients to be averaged. This again provides a small advantage as regards the computation circuitry and cost.

Alternatively, the value of the coefficient C is a measure for the reliability of the estimate of the frequency deviation because the absolute values of the elements of the channel estimation vectors H(i) and H(j) are a measure for the energy of the channel impulse response. The complex addition of the coefficients C(i) thus achieves an evaluation of the reliability of the estimate of the frequency deviation. Since in a proper approximation the interference power may be assumed to be constant for brief periods of time (the duration of a "brief" period of time depends, for example, on the frequency and the relative velocity between transmitter and receiver. In a time slot mobile radio system a brief period of time is of the order of only a couple of time slots), input signals having a rather low channel impulse response energy level are at the same time linked with a rather low signal-to-noise ratio whereas, on the other hand, received signals having a rather high channel impulse response energy level have a rather high signal-to-noise ratio. The estimates of the frequency deviation derived from received signals having a low useful signal/noise signal ratio are statistically less reliable than ,estimates derived from a signal having a very large useful signal/noise signal ratio. With the aforementioned type of averaging the considered estimates of the frequency deviation are weighted in a cost-effective way in accordance with their statistical certainty. This leads to a distinctly more reliable estimate of the frequency deviation especially with multipath radio channels liable to fading because single coefficients negatively affected by large fade-outs are strongly suppressed with this averaging technique.

In a further embodiment of the invention an interference power estimator makes estimates for the instantaneous interference power in the received signal for each period of the channel vector and prior to an averaging operation successively computed coefficients are weighted with the characteristic value of the estimated interference power value. Compared to the way of averaging described hereinbefore this way of averaging in which coefficients weighted according to interference power values are employed is advantageous especially when an averaging operation is effected over longer periods of time and the interference power may no longer be considered constant during this time interval.

In a particular embodiment it may be advantageous to combine the two ways of coefficient averaging. Such a combination is especially advantageous in time slot transmission methods in which information signals are transmitted rather wide apart between the individual blocks. In such a case it is advantageous to combine the coefficients formed during an information block to a single coefficient. Subsequently, the combined coefficients of the individual information blocks are weighted with an interference power value determined for each information block and the mean value is formed from these weighted coefficients over a plurality of successive blocks. This is advantageous in that for the entire information block only a single interference power value is determined for the weighting operation and, nevertheless, a reliable weighting within a block is possible.

The estimates produced for the frequency deviation in above way are preeminently suitable for controlling the oscillators used for the baseband conversion, so as to adjust the frequency deviation by accordingly varying the oscillators.

Another advantageous embodiment of the invention is the use of estimates in an arrangement for frequency deviation correction. This arrangement for frequency confection is inserted between the analog-to-digital converter and the channel estimators or before a baseband signal processor and multiplies the complex signal I+jQ, obtained after baseband conversion by means of sampling and analog-to-digital conversion, by a suitably sampled and digitized copy of a correction signal $g=\exp(j2\pi \cdot df(i) \cdot t)$ recovered from the frequency deviation df. When an arrangement for correcting the frequency position is used, the oscillators need not be adjusted. This is especially advantageous when a receiver alternately receives signals with different receive frequencies.

in such a ease the frequency deviation may be separately determined and stored for each receive frequency. With such a solution the otherwise inevitable transient times necessary for a readjustment of the oscillators are dispensed with completely.

The invention will be further described and explained with reference to an embodiment represented in the drawing.

DESCRIPTION OF THE PREFERRED EMBODIMENT

Figure 1:
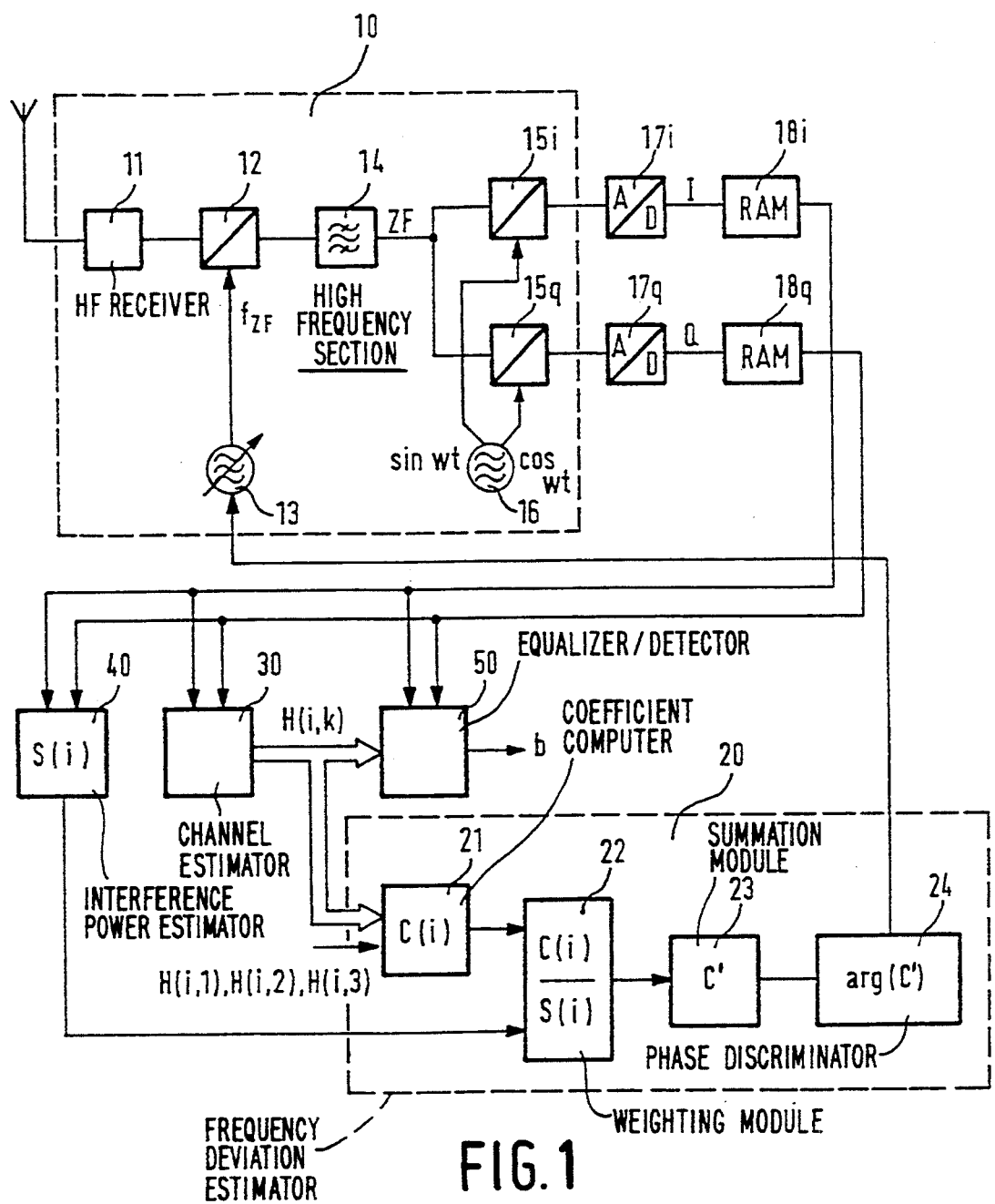
FIG. 1 shows a diagrammatic circuit arrangement of a radio receiver comprising an arrangement for estimating a frequency deviation and an oscillator frequency adjustment.
Figure 2:
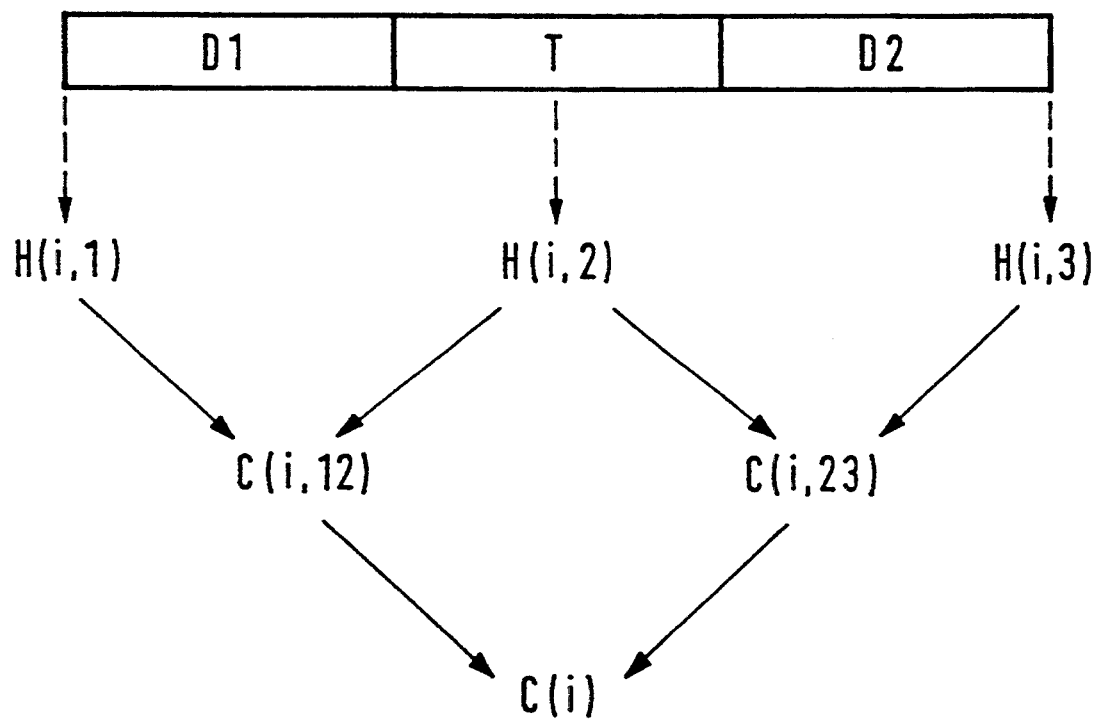
FIG. 2 gives a diagrammatic representation of a time slot containing a training sequence.

In the exemplary embodiment a receiver is described for a mobile radio system, in which a training sequence T having known data contents is enclosed by a first data sequence D1 and a second data sequence D2 in data transmitted block-by-block (cf. FIG. 2).

In the HF section 10 of this receiver a received signal is frequency-selected and converted to an intermediate frequency. For this purpose the signal received by a HF receiver stage 11 is down-converted to an intermediate frequency IF by means of an IF mixer 12 to which a variable IF mixing frequency $f_{ZF}$ is applied by an IF oscillator 13. The input signal down-converted to this first intermediate is band-pass filtered and amplified in an IF amplifier 14.

In a baseband converter 15 the intermediate frequency signal ZF is mixed with the output signal of a baseband oscillator 16, so that the signal contents of the intermediate frequency signal are converted to the baseband. In the embodiment the baseband oscillator produces two output signals which have the same frequency but which are in quadrature to each other and are applied each to its own mixer $15i$, $15q$. In this manner the so-called quadrature components I, Q of the received signal are formed. By sampling these two quadrature components and converting the sample values obtained at the sampling instants into digital values by means of an analog-to-digital converter $17i$, $17q$, a pair of values of the normal component I and the quadrature component Q is obtained each time as a sample value z, which pair is buffered in the respective memories $18i$, $18q$.

The quadrature components I, Q are applied both to an adaptive channel estimator 30, an interference power estimator 40 and also to an equalizer/detector 50. On the basis of the training sequence T contained in the data sequence the channel estimator 30 estimates for each transmitted data block the channel impulse responses of the transmit channel expected at the time of transmission. By means of the channel impulse responses estimated by the channel estimator 30 the equalizer/detector 50 performs an equalization of the quadrature components and the detection of the originally transmitted data sequence b.

The structure of such a channel estimator 30 and such an equalizer/demodulator 50 is known to those skilled in the art and is also described, for example, in the article by A. Baler, "Correlative and iterative channel estimation in adaptive Viterbi equalizers for TDMA mobile radio systems", ITC Technical Report 107 for the professional meeting of "Stochastische Modelle und Methoden in der Informationstechnik", April 1989. Further references as to the literature can be found there.

The channel estimator described there is arranged in such a way that it always forms an initial estimate $H(i,2)$ for the channel impulse response for the middle of a data block where the training data sequence T is located and accordingly adjusts the estimate of the channel impulse response while the detected data elements within the data block are taken into account. From this adjusted channel impulse response one thus always obtains a channel impulse response $H(i,1)$ at the beginning of the data block D1 and a channel impulse response $H(i,3)$ at the end of the data block D2. These three channel impulse responses of a data block are applied to the frequency deviation estimator The frequency deviation estimator 20 computes the coefficient C from each pair of channel estimation vectors of a channel impulse response. For the formation of a first coefficient $C(i,12)$ all the elements of the second channel estimation vector $H(i,2)$ are converted to their associated conjugate complex numerical value $H(i,2)*$ and the sum of the products of corresponding elements is formed with the aid of the first adjusted channel estimation vector $H(i,1)$. In the same way a second coefficient $C(i,23)$ is formed from the conjugate value of the third, also adjusted channel impulse response $H(i,3)*$ and the second channel impulse response $H(i,2)$. From these two coefficients $C(i,12)$ and $C(i,23)$ a mean coefficient $C(i)$ for the data block received in the period of time i is determined by means of an addition.

In an interference power meter 40 the interference power occurring in each data block is determined for the data block concerned. This interference power may be determined, for example, from a measurement of the noise power.

In a weighting module 22 the coefficient $C(i)$ averaged for each data block is weighted with the interference power $S(i)$ estimated for this data block in that the coefficient $C(i)$ is divided by the interference power $S(i)$. In a summation module 23 the weighted coefficients $C(i)/S(i)$ of a specific number of n previous data blocks are stored and added together, so that from this sum a mean value $C'(m)$ of the stored coefficients $C(i)$, ... $C(i-n)$ can be determined. In the embodiment the number n of coefficients $C(i)$, ... $C(i-n)$ to be stored is selected in such a way that it corresponds approximately to the number of data blocks transmitted within one second.

Finally, in a phase discriminator 24 the frequency deviation df is determined on the basis of the mean coefficient $C'$. For this purpose the imaginary pan of the mean coefficient $C'$ is divided by the real part of the mean coefficient $C'$. After multiplication by a proportionality factor the output signal of the phase discriminator 24 is applied to a control input of the IF oscillator 13. In response to this control signal the IF oscillator 13 is adjusted to the frequency deviations of the input signal.

I claim:

1. A receiver for receiving signals transmitted with a carrier frequency, comprising a base band conversion circuit receiving a carrier frequency signal, for converting the received signal into a base band frequency signal; and a frequency deviation estimator, characterized in that the receiver further comprises a channel estimator receiving said base band frequency signal for continuously forming channel estimation vectors, each of said channel estimation vectors having a plurality of complex elements as estimates of the varying instantaneous channel impulse response in a complex base band representation, and in that said frequency deviation estimator evaluates the changes in time of these channel estimation vectors.

2. A receiver as claimed in claim 1, characterized in that the frequency deviation estimator comprises means for summing products of elements of one said channel estimation vector $(H(i))$ made at one instant of time, and elements of a vector $(H(j)*)$, said elements of a vector $(H(j)*)$ being conjugate complex values of the respective elements of another said channel estimation vector $(H(j))$ made at another instant of time, to form a coefficient $(C(i))$, and means for deriving the frequency deviation from said coefficient.

3. A receiver as claimed in claim 2, characterized by comprising means for determining a mean coefficient from a predeterminable number of successive coefficients $(C(i))$.

4. A receiver as claimed in claim 2, characterized in that said means for deriving derives an angle argument $(argC(i))$ of the coefficient $(C(i))$, and determines a numerical value for the frequency deviation by division of the angle argument $(argC(i))$ by the product of a constant and the time difference $(t(i)-t(j))$ of the two channel vectors $(H(i), H(j))$.

5. A receiver as claimed in claim 4, comprising means for selecting the proportion of the imaginary part of the coefficient $(C(i))$ to the real part of the coefficient $(C(i))$ as an estimate for the angle argument $(argC(i))$.

6. A receiver as claimed in claim 2, characterized that the base band conversion circuit comprises an oscillator, and that the estimates formed by the frequent deviation estimator are used for the frequency control of said oscillator.

7. A receiver as claimed in claim 2, further comprising means for correcting tuning frequency of said base band conversion circuit to compensate for a frequency deviation of said carrier frequency signal characterized in that the estimates of the frequency deviation formed by the frequency deviation estimator are used as control magnitudes for said means for correcting tuning frequency.

8. A receiver as claimed in claim 1, further comprising means for correcting tuning frequency of said base band conversion circuit to compensate for a frequency deviation of said carrier frequency signal characterized in that the estimates of the frequency deviation formed by the frequency deviation estimator are used as control magnitudes for said means for correcting tuning frequency.

9. A receiver as claimed in claim 1, characterized in that the base band conversion circuit comprises an oscillator and that the estimates formed by the frequent deviation estimator are used for the frequency control of said oscillator.

10. A receiver for receiving signals transmitted with a carrier frequency, comprising a base band conversion circuit receiving a carrier frequency signal, for converting the received signal into a base band frequency signal; and a frequency deviation estimator, characterized in that:

the receiver comprises an interference power estimator providing estimates, and a channel estimator receiving said base band frequency signal for continuously forming channel estimation vectors as estimates of the varying instantaneous channel impulse response in a complex base band representation, and said frequency deviation estimator comprises means for summing products of elements of one said channel estimation vector (H(i)) made at one instant of time, and elements of a vector (H(j)*), said elements of a vector (H(j)*) being conjugate complex values of the respective elements of another said channel estimation vector (H(j)) made at another instant of time, to form a coefficient (C(i)), and means for deriving the frequency deviation from said coefficient, said means for deriving comprising means for weighing and then averaging said coefficient (C(i)) with said estimates from said interference power estimator.

11. A receiver as claimed in claim 10, characterized by comprising means for determined a mean coefficient from a predeterminable number of successive coefficients (C(i)).

12. A receiver as claimed in claim 10, characterized by comprising means for determining a numerical value for the frequency deviation by a division of the angle argument (argC(i)) by the product of a constant and the time difference (t(i)−t(j)) of tile two channel vectors (H(i), H(j)).

13. A receiver as claimed in claim 12, comprising means for selecting the proportion of the imaginary part of the coefficient (C(i)) to the real part of the coefficient (C(i)) as an estimate for the angle argument (argC(i)).

14. A receiver as claimed in claim 13, characterized in that the base band conversion circuit comprises an oscillator, and that the estimates formed by the frequent deviation estimator are used for the frequency control of said oscillator.

15. A receiver as claimed in claim 14, further comprising means for correcting tuning frequency of said base band conversion circuit to compensate for a frequency deviation of said carrier frequency signal characterized in that the estimates of the frequency deviation formed by the frequency deviation estimator are used as control magnitudes for said means for correcting tuning frequency.

16. A receiver as claimed in claim 12, further comprising means for correcting tuning frequency of said base band conversion circuit to compensate for a frequency deviation of said carrier frequency signal characterized in that the estimates of the frequency deviation formed by the frequency deviation estimator are used as control magnitudes for said means for correcting tuning frequency.

17. A receiver as claimed in claim 10, further comprising means for correcting tuning frequency of said base band conversion circuit to compensate for a frequency deviation of said carrier frequency signal characterized in that the estimates of the frequency deviation formed by the frequency deviation estimator are used as control magnitudes for said means for correcting tuning frequency.

* * * * *